United States Patent
Yen et al.

(10) Patent No.: US 12,112,875 B2
(45) Date of Patent: Oct. 8, 2024

(54) INTEGRATED CIRCUIT

(71) Applicant: Realtek Semiconductor Corporation, Hsinchu (TW)

(72) Inventors: Hsiao-Tsung Yen, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 841 days.

(21) Appl. No.: 17/236,215

(22) Filed: Apr. 21, 2021

(65) Prior Publication Data

US 2021/0375520 A1 Dec. 2, 2021

(30) Foreign Application Priority Data

May 29, 2020 (TW) ................................ 109118142

(51) Int. Cl.
*H01F 27/28* (2006.01)
*H01F 27/00* (2006.01)
*H01F 27/29* (2006.01)
*H01L 49/02* (2006.01)

(52) U.S. Cl.
CPC ....... *H01F 27/006* (2013.01); *H01F 27/2804* (2013.01); *H01F 27/29* (2013.01); *H01L 28/10* (2013.01); *H01F 2027/2819* (2013.01)

(58) Field of Classification Search
CPC ......... H01F 17/0013; H01F 2027/2809; H01F 17/0006; H01F 27/2804; H01F 5/003; H01F 27/006; H01F 27/29; H01L 28/10
USPC .................................................. 336/200, 232
See application file for complete search history.

(56) References Cited

U.S. PATENT DOCUMENTS

| | | | |
|---|---|---|---|
| 9,824,812 B2 | 11/2017 | Huang et al. | |
| 10,153,078 B2 | 12/2018 | Yen et al. | |
| 10,186,364 B2 | 1/2019 | Yen et al. | |
| 2011/0148733 A1* | 6/2011 | Fahs | H01P 5/10 343/859 |
| 2014/0077919 A1* | 3/2014 | Godoy | H01F 30/08 336/226 |
| 2015/0170824 A1* | 6/2015 | Tesson | H01F 27/2804 336/190 |
| 2019/0088734 A1* | 3/2019 | Yen | H01L 23/5227 |
| 2019/0221350 A1 | 7/2019 | Yen et al. | |
| 2019/0279809 A1 | 9/2019 | Yen | |
| 2019/0392980 A1 | 12/2019 | Yen | |
| 2020/0266792 A1 | 8/2020 | Bagga | |
| 2020/0312511 A1 | 10/2020 | Yen et al. | |
| 2020/0312512 A1 | 10/2020 | Yen et al. | |

FOREIGN PATENT DOCUMENTS

| | | | |
|---|---|---|---|
| CN | 109560070 A | 4/2019 | |
| CN | 110537234 A | 12/2019 | |
| TW | 201837932 A | 10/2018 | |
| TW | 201931665 A | 8/2019 | |
| WO | WO-2018189234 A1 * | 10/2018 | H01F 19/04 |

* cited by examiner

*Primary Examiner* — Tszfung J Chan
(74) *Attorney, Agent, or Firm* — Locke Lord LLP; Tim Tingkang Xia, Esq.

(57) ABSTRACT

An integrated circuit includes a first coil and a second coil. The first coil is disposed on the first side of the integrated circuit. The second coil is disposed on the second side of the integrated circuit, and is partially overlapped with the first coil at a junction. The first coil is not interlaced with the second coil at the junction.

18 Claims, 4 Drawing Sheets

INTEGRATED CIRCUIT

CROSS-REFERENCE TO RELATED APPLICATION

The present application claims priority to Taiwan Application Serial Number 109118142, filed May 29, 2020, which is incorporated herein by reference in its entirety.

BACKGROUND

Technical Field

The present disclosure relates to an integrated circuit. More particularly, the present disclosure relates to an integrated circuit of a transformer.

Description of Related Art

The existing various types of integrated circuits used for inductor device or transformer device have their advantages and disadvantages. For example, a spiral inductor has higher quality factor value and mutual inductance value but is hard to be designed into a symmetrical structure. Though the stacked transformer has better symmetry, it needs more area and metal layers because of the interlacing (or crossing) structure between coils. In addition, the coil connected with the metal layer with lower conductivity and the coils stacked vertically would cause a lot of parasitic capacitance, and lower the quality factor value. Therefore, the scope of application of inductors and the transformers mentioned above is limited.

SUMMARY

In order to solve the problem mentioned above, the present disclosure provides a stack design of 8-shaped inductors, which is different from the conventional 8-shaped inductor. The present disclosure provides a integrated circuit including a first coil and a second coil. The first coil is disposed on the first side of the integrated circuit. The second coil is disposed on the second side of the integrated circuit, and is partially overlapped with the first coil at a junction. The first coil is not interlaced with the second coil at the junction.

It is to be understood that both the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
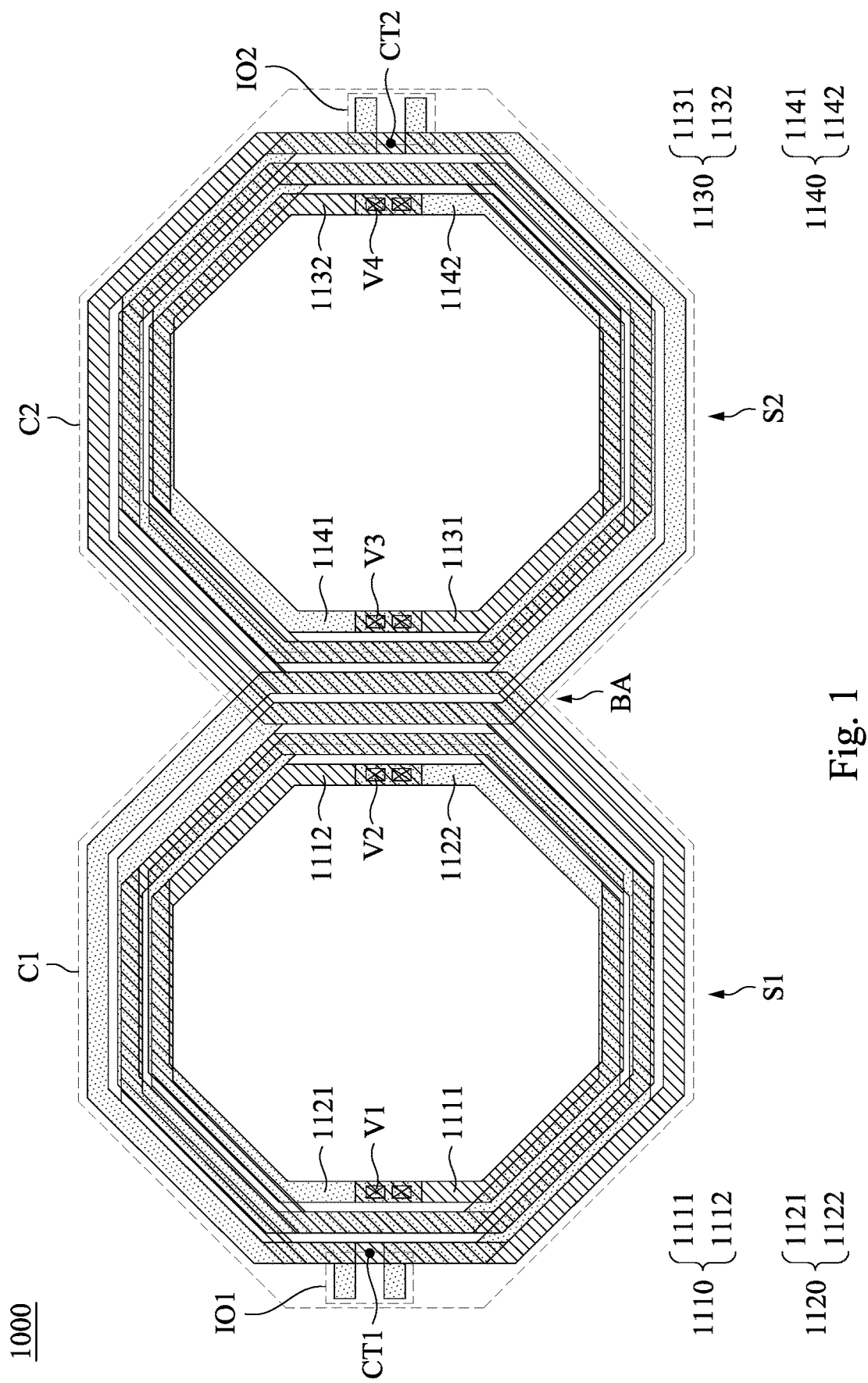
FIG. 1 is a schematic diagram illustrating an integrated circuit, in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

It will be understood that, although the terms first, second, third etc. may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present disclosure.

The terms herein are used for describing particular embodiments and are not intended to be limited thereto. Single forms such as "a", "this", "the", as used herein also include the plurality form.

In the description herein and throughout the claims that follow, the terms "coupled" or "connected" in this document may be used to indicate that two or more elements physically or electrically contact with each other, directly or indirectly. They may also be used to indicate that two or more elements cooperate or interact with each other.

In the description herein and throughout the claims that follow, the terms "comprise" or "comprising," "include" or "including," "have" or "having," "contain" or "containing" and the like used herein are to be understood to be open-ended, i.e., to mean including but not limited to.

In the description herein and throughout the claims that follow, the phrase "and/or" includes any and all combinations of one or more of the associated listed claims.

In the description herein and throughout the claims that follow, unless otherwise defined, all terms have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference is now made to FIG. 1. FIG. 1 is a schematic diagram illustrating an integrated circuit 1000, in accordance with some embodiments of the present disclosure. As shown in FIG. 1, integrated circuit 1000 includes a first coil C1 and a second coil C2. The first coil C1 is disposed on a first side S1 (e.g., left half) of the integrated circuit 1000. The second coil C2 is disposed on a second side S2 (e.g., right half) of the integrated circuit 1000. In some embodiments, the first coil C1 is partially overlapped with the second coil C2 at a junction BA. In some embodiments, the first coil C1 is not interlaced with the second coil C2 at the junction.

In some embodiments, the first coil C1 and the second coil C2 includes a number of circles respectively, and each circle includes a number of wires. The wires of the first coil C1 located at the junction BA are completely or substantially in parallel with the wires of the second coil C2 located at the junction BA. The integrated circuit 1000 in this embodiment provides a novel 8-shaped inductor with stack design. Different from central crossing structure designed in the conventional 8-shaped inductor, the junction BA of the 8-shaped stacking integrated circuit for inductor or transformer in the present disclosure is designed without crossing. In some embodiments, the integrated circuit 1000 is a central symmetrical structure. In some embodiments, the integrated circuit 1000 is a transformer.

It should be understood that, the integrated circuit 1000 in the present disclosure is a 8-shaped structure including two octagon. However, in some other embodiments, the integrated circuit 1000 can also be composed of other polygons.

Figure 2:
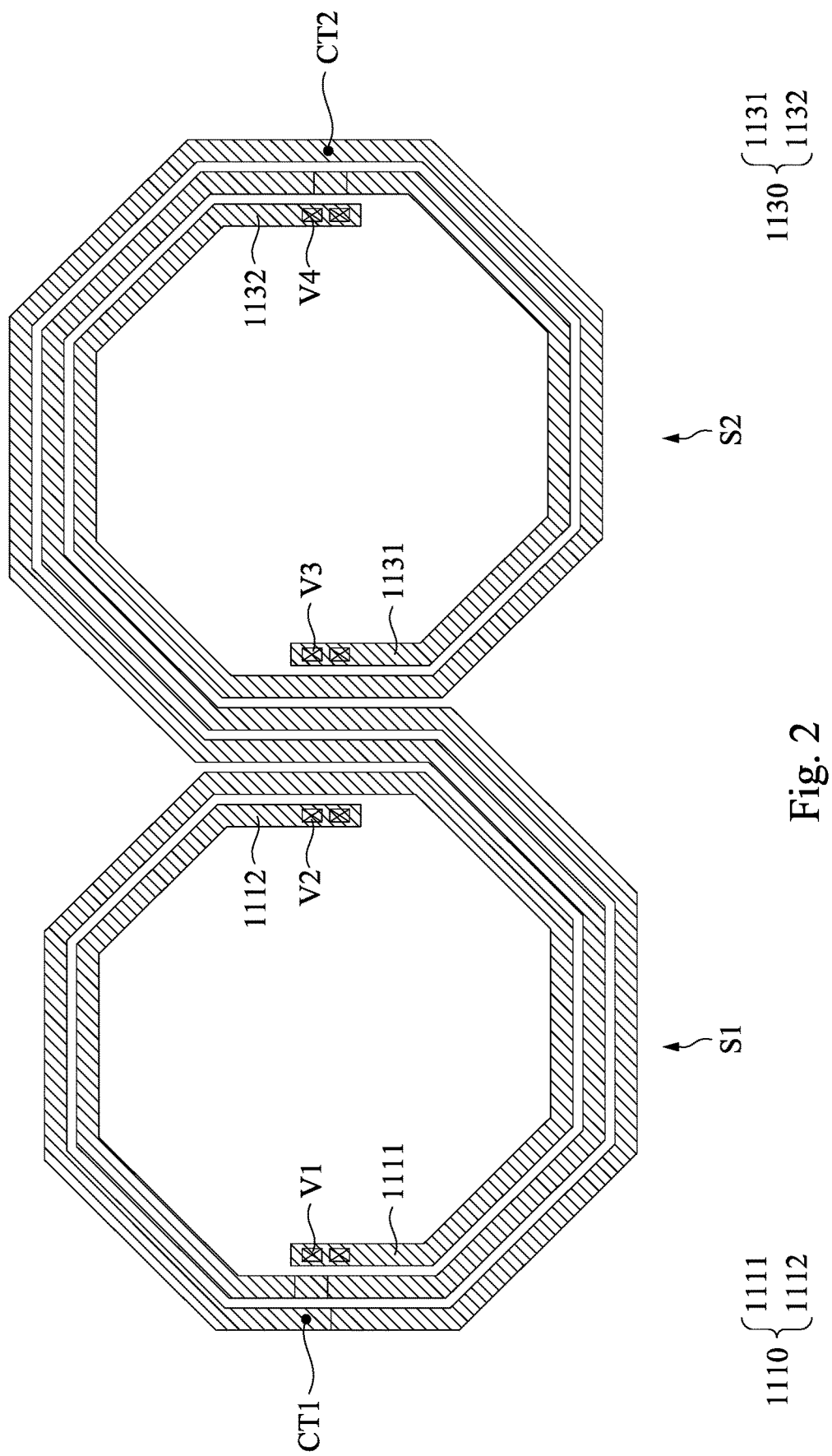
FIG. 2 is a schematic diagram illustrating a partial structure of the integrated circuit shown in FIG. 1, in accordance with some embodiments of the present disclosure.
Figure 3:
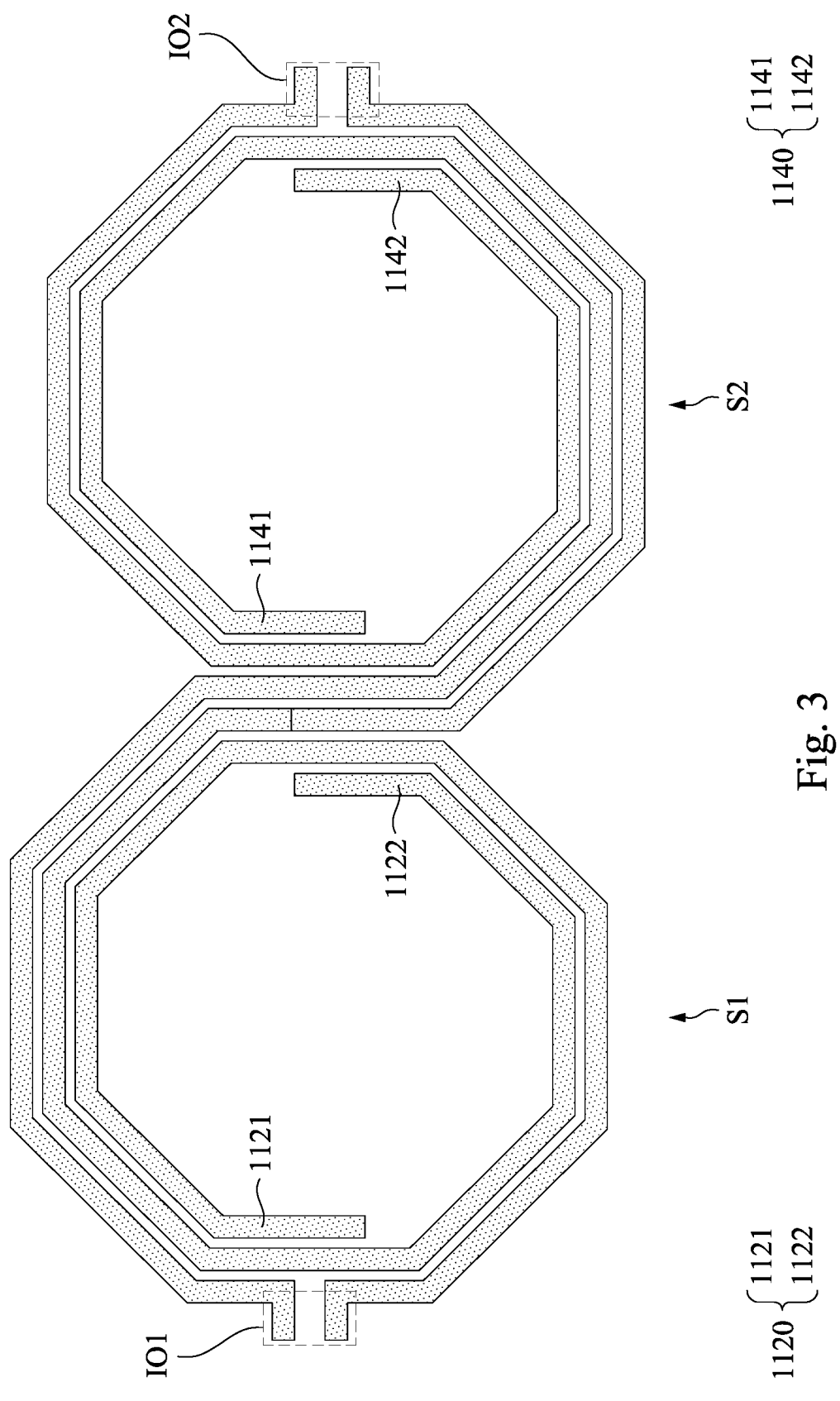
FIG. 3 is a schematic diagram illustrating a partial structure of the integrated circuit shown in FIG. 1, in accordance with some embodiments of the present disclosure.

For ease of understanding, the integrated circuit 1000 shown in FIG. 1 can be divided into a partial structure 1100 of the integrated circuit 1000 shown in FIG. 2 and a partial structure 1200 of the integrated circuit 1000 shown in FIG. 3. For Structure and connection in detail, please refer to FIG. 1 to FIG. 3 and the following paragraphs.

In some embodiments, the first coif C1 includes a first circle 1110 and a second circle 1120. The first circle 1110 is partially overlapped with the second circle 1120 in vertical direction, and the first circle 1110 can be disposed below the second circle 1120 or above the second circle 1120.

In some embodiments, the first circle 1110 includes a first portion 1111 and a second portion 1112, and the second circle 1120 also includes a first portion 1121 and a second portion 1122. In some embodiments, the first circle 1110 and the second circle 1120 are located on different metal layers, which can be coupled through a vertical connector (e.g., via). For example, the first portion 1111 of the first circle 1110 can be coupled to the first portion 1121 of the second circle 1120, through a via V1, at one side of the first coil C1 opposite to the junction BA (e.g., left hand side in figure). The second portion 1112 of the first circle 1110 can be coupled to the second portion 1122 of the second circle 1120, through a via V2, at one side of the first coil C1 same as the junction BA (e.g., right hand side in figure). It should be understood that, the first circle 1110 in the present disclosure can be coupled to the second circle 1120 by various number or type of the vertical connectors, which will not be limited to those shown in FIG. 1 and FIG. 2.

In some embodiments, the second coil C2 includes a third circle 1130 and a fourth circle 1140. The third circle 1130 is partially overlapped with the fourth circle 1140 in vertical direction, and the third circle 1130 can be disposed below the fourth circle 1140 or above the fourth circle 1140.

In some embodiments, the third circle 1130 includes a first portion 1131 and a second portion 1132, and the fourth circle 1140 also includes a first portion 1141 and a second portion 1142. In some embodiments, the third circle 1130 and the fourth circle 1140 are located on different metal layers, which can be coupled through a vertical connector (e.g., via). For example, the first portion 1131 of the third circle 1130 can be coupled to the first portion 1141 of the fourth circle 1140, through a via V3, at one side of the second coil C2 same as the junction BA (e.g., left hand side in figure). The second portion 1132 of the third circle 1130 can be coupled to the second portion 1142 of the fourth circle 1140, through a via V4, at one side of the second coil C2 opposite to the junction BA (e.g., right hand side in figure). It should be understood that, the third circle 1130 in the present disclosure can be coupled to the fourth circle 1140 by various number or type of the vertical connectors, which will not be limited to those shown in FIG. 1 and FIG. 2.

In some embodiments, the first circle 1110 and the third circle 1130 included in FIG. 2 are disposed on same metal layer, which is illustrated with diagonal grid. In some embodiments, the second circle 1120 and the fourth circle 1140 included in FIG. 3 are disposed on same metal layer, which is illustrated with dotted grid.

In some embodiments, the first portion 1111 of the first circle 1110 is wound out approximately a round and half, from the innermost wire of the first coil C1 at the side opposite to the junction BA (e.g., left hand side in figure), and is coupled to the first portion 1131 of the third circle 1130 at the side same as the junction BA. The first portion 1131 of the third circle 1130 is then wound in approximately a round, to the side same as the junction BA in the second coil C2. In some embodiments, the second portion 1112 of the first circle 1110 is wound out approximately a round from the innermost wire of the first coil C1 at the side same as the junction BA, and is coupled to the second portion 1132 of the third circle 1130 at the side same as the junction BA. The second portion 1132 of the third circle 1130 is then wound in approximately a round and half in the second coil C2, to the side opposite to the junction BA in the second coil C2 (e.g., right hand side in figure). The first circle 1110 can be coupled to the third circle 1130 without a vertical connector because they are disposed on the same metal layer.

In some embodiments, the first portion 1121 of the second circle 1120 is wound out approximately a round and half from the innermost wire of the first coil C1 at the side opposite to the junction BA, and is coupled to the first portion 1141 of the fourth circle 1140 at the side same as the junction BA. The first portion 1141 of the fourth circle 1140 then wound in approximately a round in the second coil C2, to the side same as the junction BA in the second coil C2.

In some embodiments, the first portion 1121 of the second circle 1120 has an opening at one side opposite to the junction BA in the first coil C1 (e.g., left hand side in figure). Both ends of the opening form a first input and output terminal IO1.

In some embodiments, the second portion 1122 of the second circle 1120 is wound out approximately a round from the innermost wire if the first coil C1 at the side same as the junction BA, and is coupled to the second portion 1142 of the fourth circle 1140 at the side of the junction BA. Then, the second portion 1142 of the fourth circle 1140 is wound in approximately a round and half in the second coil C2, to the side opposite to the junction BA in the second coil C2.

In some embodiments, the second portion 1142 of the fourth circle 1140 has an opening at the side opposite to the junction BA in the second coil C2 (e.g., right hand side in figure). Both ends of the opening form a second input and output terminal IO2. The second circle 1120 can be coupled to the fourth circle 1140 without a vertical connector because they are disposed on the same metal layer.

In some embodiments, the integrated circuit 1000 includes a first center-tapped terminal CT1, disposed on outermost wire on one side opposite to the junction BA in the first coil C1 (e.g., left hand side in figure), and disposed on the metal layer same as the first circle 1110. In some embodiments, the integrated circuit 1000 includes a second center-tapped terminal CT2, disposed on outermost wire on one side opposite to the junction BA in the second coil C2 (e.g., right hand side in figure), and disposed on the metal layer same as the third circle 1130.

Figure 4:
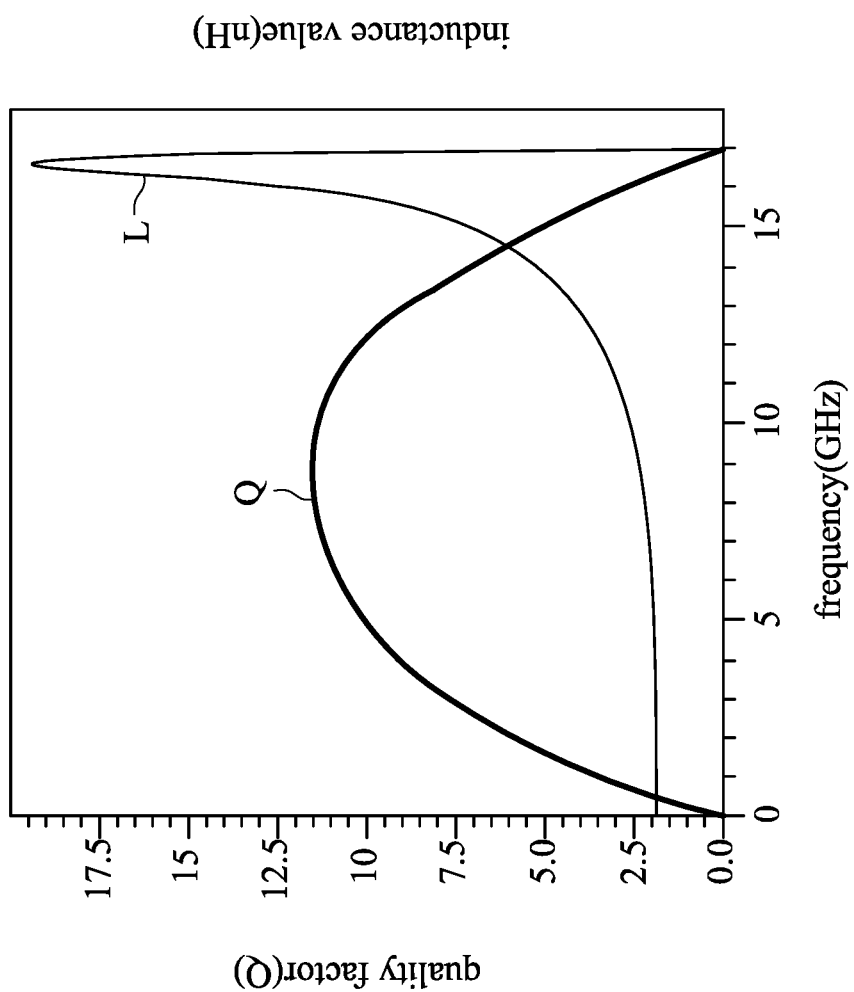
FIG. 4 is a schematic diagram illustrating experimental data, in accordance with some embodiments of the present disclosure.

FIG. 4 is a schematic diagram illustrating experimental data, in accordance with some embodiments of the present disclosure. As shown in FIG. 4, with the structural configuration according to the present disclosure in the differential mode, the experimental curve of the quality factor is Q and the experimental curve of the inductance value is L. As can be seen from the figure, the integrated circuit 1000 with the structure of the present disclosure has a better quality factor. For example, the integrated circuit 1000 has an inductance value that can reach about 2 nH and a quality factor (Q) of about 10 at a frequency of 5 GHz within an area of 134 um*222 um.

In sum, with configurations of the first coil and the second coil stacked without interlacing, the area of the integrated circuit 1000, particularly the 8-shaped transformer, provided in the present disclosure, has better quality factor (Q), better structural symmetry, and smaller area.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An integrated circuit, comprising:
   a first coil disposed on a first side of the integrated circuit and comprising a first circle and a second circle; and
   a second coil disposed on a second side of the integrated circuit, comprising a third circle and a fourth circle, and is partially overlapped with the first coil at a junction;
   wherein the first coil is not interlaced with the second coil at the junction,
   wherein the first circle and the third circle are located on a first metal layer, and the second circle and the fourth circle are located on a second metal layer,
   wherein an end of a first portion of the second circle and an end of a first portion of the fourth circle form a first input and output terminal on the second metal layer, and an end of a second portion of the second circle and an end of a second portion of the fourth circle form a second input and output terminal on the second metal layer.

2. The integrated circuit of claim 1, wherein part of the first coil is substantially in parallel with part of the second coil at the junction.

3. The integrated circuit of claim 1, wherein the first coil comprises:
   the first circle, comprising a first portion and a second portion; and
   the second circle, comprising the first portion and the second portion;
   wherein the first circle is partially overlapped with the second circle in a vertical direction, and the first portion of the first circle is coupled to the first portion of the second circle, and the second portion of the first circle is coupled to the second portion of the second circle.

4. The integrated circuit of claim 3, wherein the first circle is disposed below the second circle or above the second circle.

5. The integrated circuit of claim 3, wherein the first circle and the second circle are located on different metal layers.

6. The integrated circuit of claim 3, wherein the second coil comprises:
   the third circle, comprising a first portion and a second portion; and
   the fourth circle, comprising the first portion and the second portion;
   wherein the third circle is partially overlapped with the fourth circle in a vertical direction, and the first portion of the third circle is coupled to the first portion of the fourth circle, and the second portion of the third circle is coupled to the second portion of the fourth circle.

7. The integrated circuit of claim 6, wherein the third circle is disposed below the fourth circle or above the fourth circle.

8. The integrated circuit of claim 6, wherein the third circle and the fourth circle are located on different metal layers.

9. The integrated circuit of claim 6, wherein the first circle and the third circle are located on a same metal layer.

10. The integrated circuit of claim 6, wherein the second circle and the fourth circle are located on a same metal layer.

11. The integrated circuit of claim 6, wherein the first portion of the first circle is coupled to the first portion of the third circle at one side of the first coil same as the junction, and the second portion of the first circle is coupled to the second portion of the third circle at one side of the first coil same as the junction.

12. The integrated circuit of claim 6, wherein the first portion of the second circle is coupled to the first portion of the fourth circle at one side of the first coil same as the junction, and the second portion of the second circle is coupled to the second portion of the fourth circle at one side of the second coil same as the junction.

13. The integrated circuit of claim 1, wherein the first input and output terminal is disposed on one side opposite to the junction in the first coil.

14. The integrated circuit of claim 1, wherein the second input and output terminal is disposed on one side opposite to the junction in the second coil.

15. The integrated circuit of claim 6, further comprising:
   a first center-tapped terminal disposed on one side opposite to the junction in the first coil.

16. The integrated circuit of claim 15, wherein the first center-tapped terminal and the first circle are located on a same metal layer.

17. The integrated circuit of claim 16, further comprising:
   a second center-tapped terminal disposed on one side opposite to the junction in the second coil.

18. The integrated circuit of claim 17, wherein the second center-tapped terminal and the third circle are located on a same metal layer.

* * * * *